(12) United States Patent
Sato et al.

(10) Patent No.: US 9,316,684 B2
(45) Date of Patent: Apr. 19, 2016

(54) SEMICONDUCTOR DEVICE, DETECTION METHOD AND PROGRAM

(75) Inventors: Yasuo Sato, Iizuka (JP); Seiji Kajihara, Iizuka (JP); Michiko Inoue, Ikoma (JP); Tomokazu Yoneda, Ikoma (JP); Hyunbean Yi, Ikoma (JP); Yukiya Miura, Hino (JP)

(73) Assignees: KYUSHU INSTITUTE OF TECHNOLOGY, Fukuoka (JP); NATIONAL UNIVERSITY CORPORATION NARA INSTITUTE OF SCIENCE AND TECHNOLOGY, Nara (JP); TOKYO METROPOLITAN UNIVERSITY, Tokyo (JP)

( * ) Notice: Subject to any disclaimer, the term of this patent is extended or adjusted under 35 U.S.C. 154(b) by 715 days.

(21) Appl. No.: 13/635,057

(22) PCT Filed: Mar. 14, 2011

(86) PCT No.: PCT/JP2011/055900
§ 371 (c)(1),
(2), (4) Date: Sep. 14, 2012

(87) PCT Pub. No.: WO2011/115038
PCT Pub. Date: Sep. 22, 2011

(65) Prior Publication Data
US 2013/0013247 A1 Jan. 10, 2013

(30) Foreign Application Priority Data

Mar. 15, 2010 (JP) .................................. 2010-057310

(51) Int. Cl.
*G01R 31/28* (2006.01)
*G01R 31/30* (2006.01)

(52) U.S. Cl.
CPC ........ *G01R 31/2884* (2013.01); *G01R 31/3016* (2013.01)

(58) Field of Classification Search
CPC ........... G01R 31/3004; G01R 31/3016; G01R 31/31725; G11C 29/12; G11C 29/50; G11C 29/4402; G06F 1/3203; G06F 1/3296; Y02B 60/1217; H01L 2924/00; H01L 2924/0002
USPC ....... 324/750.3, 762.01, 762.02; 374/E7.001, 374/E7.035, 176; 702/58, 69, 117, 130
See application file for complete search history.

(56) References Cited

U.S. PATENT DOCUMENTS 6,889,165 B2 * 5/2005 Lind et al. ...................... 702/183
6,900,650 B1 * 5/2005 Sheng et al. ............. 324/750.07

(Continued)

FOREIGN PATENT DOCUMENTS

JP 7-191095 7/1995
JP 9-061503 3/1997

(Continued)

OTHER PUBLICATIONS

Sato, et al, "A Survey of Approaches for High Field Reliability," REAJ, vol. 31, No. 7, pp. 514-519. (English abstract included).

(Continued)

*Primary Examiner* — John Breene
*Assistant Examiner* — Jeffrey Aiello
(74) *Attorney, Agent, or Firm* — Rankin, Hill & Clark LLP

(57) ABSTRACT

A semiconductor device and the like that can determine the performance of a semiconductor integrated circuit with higher accuracy even when test environment fluctuates. The semiconductor device detects degradation of the semiconductor integrated circuit, including measurement unit that measures temperature and voltage, decision unit that judges whether the test is executed within an allowable test timing in the detection target circuit portion at each test operation frequency and decides a maximum test operation frequency and calculation unit that converts a maximum test operation frequency into that at a standard temperature and voltage and calculates a degradation amount. The semiconductor integrated circuit has a monitor block circuit that monitors the values for the measurement unit to measure temperature and voltage. The measurement unit has estimation unit that estimates temperature and voltage of a detection target circuit portion based on the monitored values. The calculation unit uses the estimated temperature and voltage.

11 Claims, 8 Drawing Sheets

(56) References Cited

U.S. PATENT DOCUMENTS

| | | | |
|---|---|---|---|
| 8,081,003 B2* | 12/2011 | Pacha et al. | 324/537 |
| 2002/0180476 A1* | 12/2002 | Inoshita et al. | 324/765 |
| 2003/0184336 A1* | 10/2003 | Kobayashi | 324/765 |
| 2004/0002174 A1* | 1/2004 | Vollrath et al. | 438/14 |
| 2005/0194963 A1* | 9/2005 | Raichman et al. | 324/158.1 |
| 2005/0254325 A1* | 11/2005 | Meguro et al. | 365/202 |
| 2005/0283630 A1* | 12/2005 | Shikata | 713/322 |
| 2008/0035921 A1* | 2/2008 | Gonzalez et al. | 257/48 |
| 2008/0218198 A1* | 9/2008 | Yasuda | 326/16 |
| 2008/0244278 A1* | 10/2008 | Monferrer | G01R 31/025 713/300 |
| 2008/0249743 A1* | 10/2008 | Hirohata | G01R 31/2803 702/181 |
| 2009/0058443 A1* | 3/2009 | Ohashi et al. | 324/754 |
| 2009/0108863 A1* | 4/2009 | Gonzalez et al. | 324/765 |
| 2009/0287909 A1* | 11/2009 | Vera | G06F 11/008 712/220 |
| 2010/0033204 A1* | 2/2010 | Santo | 324/765 |
| 2010/0123483 A1* | 5/2010 | Chung et al. | 327/63 |
| 2011/0044118 A1* | 2/2011 | Walker | 365/189.09 |

FOREIGN PATENT DOCUMENTS

| | | |
|---|---|---|
| JP | 9-292436 | 11/1997 |
| JP | 2003-068865 | 3/2003 |
| JP | 2010-524101 | 7/2010 |

OTHER PUBLICATIONS

Y. Sato, et al, "A Circuit Failure Prediction Mechanism (DART) for High Field Reliability," The 8th IEEE International Conference on ASIC, pp. 581-584, 2009.

T. Vo, et al, "Design for Board and System Level Structure Test and Diagnosis," Proc. Intl. Test Conf., Paper 14.1 1-10, 2006.

Y. Li, et al, "CASP: Concurrent Autonomous Chip Self-Test Using Stored Test Patterns," Proc. Design Automation and Test in Europe, pp. 885-890, 2008.

O. Khan, et al, "A Self-Adaptive System Architecture to Address transistor Aging," Proc. Design Automation and Test in Europe, pp. 81-86, 2009.

* cited by examiner

Fig. 4

| Test time | Test unit | Test | $F_{MAX}$ | $T_C$ | $V_C$ | $F_{MAX}$ @$T_{TYP}$,$V_{TYP}$ |
|---|---|---|---|---|---|---|
| 200912111315 | CORE1 | TEST1 | 80 | 50 | 1.5 | 85 |
| 200912111315 | CORE2 | TEST1 | 64 | 45 | 1.4 | 68 |
| 200912130910 | CORE1 | TEST2 | 85 | 55 | 1.6 | 84 |
| 200912130910 | CORE2 | TEST2 | 63 | 45 | 1.4 | 67 |
| 200912160805 | CORE1 | TEST3 | 70 | 80 | 1.3 | 85 |
| 200912160905 | CORE2 | TEST3 | 60 | 75 | 1.4 | 66 |
| 201001050715 | CORE1 | TEST1 | 80 | 27 | 1.5 | 85 |
| 201001050715 | CORE2 | TEST1 | 68 | 27 | 1.5 | 68 |
| 201001150908 | CORE1 | TEST3 | 76 | 80 | 1.5 | 86 |
| 201001150908 | CORE2 | TEST3 | 60 | 75 | 1.5 | 68 |

SEMICONDUCTOR DEVICE, DETECTION METHOD AND PROGRAM

TECHNICAL FIELD

The present invention relates to a semiconductor device, a detection method and a program, and particularly relates to a semiconductor device for detecting degradation which occurs in a semiconductor integrated circuit or variability which occurs in pluralities of same kinds of semiconductor integrated circuits, and the like.

BACKGROUND ART

Ensuring the reliability and security of extremely miniaturized semiconductor integrated circuits is a crucial social challenge. There are various test methods proposed so far (Refer to Non-Patent Document 1 and 2.)

For example, a Built-In Self-Test (BIST) is proposed as a testing method by which testing after shipment is possible (Refer to Patent Document 1 and 2.)

PRIOR ART DOCUMENTS

Patent Document

[Patent Document 1]: Japanese Unexamined Patent Application Publication No. 2003-68865.
[Patent Document 2]: Japanese Unexamined Patent Application Publication No. 2010-524101.

Non-Patent Documents

[Non-Patent Document 1]: Sato, et al, "A Survey of Approaches for High Field Reliability," REAJ, Vol. 31, No. 7, pp. 514-519.
[Non-Patent Document 2]: Y. Sato, et al, "A Circuit Failure Prediction Mechanism (DART) for High Field Reliability," The 8th IEEE International Conference on ASIC, pp. 581-584, 2009.
[Non-Patent Document 3]: T. Vo, et al, "Design for Board and System Level Structure Test and Diagnosis," Proc. Intl. Test Conf., Paper 14.1 1-10, 2006.
[Non-Patent Document 4]: Y. Li, et al, "GASP: Concurrent Autonomous Chip Self-Test Using Stored Test Patterns," Proc. Design Automation and Test in Europe, pp. 885-890, 2008.
[Non-Patent Document 5]: O. Khan, et al, "A Self-Adaptive System Architecture to Address transistor Aging," Proc. Design Automation and Test in Europe, pp. 81-86, 2009.

SUMMARY OF THE INVENTION

Problem to be Solved by the Invention

Conventional test methods focus only on the operation performance of the semiconductor integrated circuits at the time of testing. Thus, conventional test methods test the circuits basically under the same environment where temperature and so on are controlled. As this, conventional test methods basically control the operation environment of semiconductor integrated circuits according to test in order to keep the accuracy of tests.

However, semiconductor integrated circuits are produced and used under various environments where temperature and so on cannot always be controlled. In particular, tests in field are executed while the semiconductor integrated circuits are used and the control of test environment such as temperature is difficult. According to the method described in the Patent-Document 2, the test of semiconductor integrated circuits is executed after shipment under the control of test environment such as voltage. However, complicated special equipment is necessary to control the test environment. Such equipment cannot necessarily be applicable to all the semiconductor integrated circuits which need testing.

If the test environment such as temperature cannot be controlled, the test environment could influence the test results of semiconductor integrated circuits. For example, according to the simulation by the present inventors, the variance of 1 degree Celsius can cause the delay of 17 ps/cycle. In the operation environment of 1 GHz, 1 cycle corresponds to 1 ns. Thus, such a delay derived from environmental variance is not a negligibly-small difference at all. Only a variance of temperature can make it difficult to analyze a test result. Thus, it is difficult for the conventional tests to keep high accuracy when the environment varies even if it were executed during production or during use.

It is, therefore, an object of the present invention to provide a semiconductor device and the like capable of judging the operation performance of semiconductor integrated circuits with more accuracy even when test environment varies.

Means for Solving the Problem

A first aspect in accordance with the present invention provides a semiconductor device for detecting degradation which occurs in a semiconductor integrated circuit having a detection target circuit portion where a test is executed, comprising a measurement unit that measures a temperature and a voltage of where the detection target circuit portion is, a decision unit that judges whether the test is executed within an allowable test timing in the detection target circuit portion at each test operation frequency or not and decides a maximum test operation frequency, of where the detection target circuit is, at which the test can be executed, and a calculation unit that converts the maximum test operation frequency decided by the decision unit based on the temperature and the voltage measured by the measurement unit into a maximum test operation frequency at a standard temperature and a standard voltage, and calculates, based on a converted maximum test operation frequency, a degradation amount which indicates degree of degradation, wherein the semiconductor integrated circuit has a monitor block circuit that monitors a value used by the measurement unit to measure the temperature and the voltage, the measurement unit has an estimation unit that estimates a temperature and a voltage of where the detection target circuit portion is, every time a test is executed, based on a monitored value by the monitor block circuit which operated at a temperature and a voltage of where the detection target circuit portion is, and the calculation unit uses the temperature and the voltage estimated by the estimation unit as the temperature and the voltage measured by the measurement unit and converts the maximum test operation frequency decided by the decision unit into the maximum test operation frequency at the standard temperature and the standard voltage.

A second aspect in accordance with the present invention provides the semiconductor device of the first aspect, further comprising n (n is an integer equal to or more than 2) of the monitor block circuits, wherein the measurement unit measures a measured frequency $F_i$ (i is an integer equal to or less than n) obtained as an oscillation number of times at each monitor block circuit within a predetermined time, and the estimation unit estimates the temperature T and the voltage V of where the detection target circuit portion is by calculating coefficients $\alpha_i$, $\beta$, $\alpha'_i$, and $\beta'$ in an equation (eq1).

Equation 1

$$T = \sum_{i=1}^{n} \alpha_i F_i + \beta,$$

$$V = \sum_{i=1}^{n} \alpha'_i F_i + \beta'.$$

(eq 1)

A third aspect in accordance with the present invention provides the semiconductor device of the second aspect, wherein the estimation unit estimates the temperature T and the voltage V of where the detection target circuit portion is by dividing a temperature range or a voltage range into pluralities of divisions and calculating the coefficients $\alpha_i$, $\beta$, $\alpha'_i$, and $\beta'$ in an equation (eq1) for each of the divisions, or by dividing a temperature range into pluralities of divisions and calculating the coefficients $\alpha_i$, and $\beta$ in an equation (eq1) for each of the divisions with dividing a voltage range into pluralities of divisions and calculating the coefficients $\alpha'_i$, and $\beta'$ in an equation (eq1) for each of the divisions.

A fourth aspect in accordance with the present invention provides the semiconductor device of the second or the third aspect, wherein the estimation unit estimates the temperature T and the voltage V of where the detection target circuit portion is by using a frequency difference $\Delta F_i$ which is a difference between the measured frequency $F_i$ and a first measured frequency $F_{i0}$, instead of using the measured frequency $F_i$.

A fifth aspect in accordance with the present invention provides the semiconductor device of any of the first through fourth aspects, further comprising a storing unit that stores a combination of measured values measured by the measurement unit and a maximum test operation frequency decided by the decision unit, wherein the calculation unit uses measured values and a maximum test operation frequency stored by the storing unit.

A sixth aspect in accordance with the present invention provides the semiconductor device of the fifth aspect, wherein the maximum test operation frequency is decided through calculation to remove random noise based on pluralities of maximum test operation frequencies stored by the storing unit at different tests.

A seventh aspect in accordance with the present invention provides the semiconductor device of any of the first through sixth aspects, wherein the measurement unit measures an initial temperature and an initial voltage in a test at a predetermined test operation frequency, and the decision unit decides a maximum test operation frequency candidate at the initial temperature and the initial voltage using the standard temperature, the standard voltage and a maximum test operation frequency at a previous time, and decides, by decreasing a frequency after increasing or by only increasing or only decreasing a frequency, a maximum test operation frequency at which the test can be executed.

An eighth aspect in accordance with the present invention provides the semiconductor device of any of the first through seventh aspects, wherein tests are prepared for each of different lengths of paths to be tested.

A ninth aspect in accordance with the present invention provides the semiconductor device of any of the first through eighth aspects, wherein the test or an order of the test is modifiable according to an allowable test timing and/or the degradation amount.

A tenth aspect in accordance with the present invention provides a semiconductor device for detecting variability which occurs in pluralities of same kinds of semiconductor integrated circuits where a test is executed, comprising a measurement unit that measures a temperature and a voltage where the detection target circuit portion is, a decision unit that judges whether the test is executed within an allowable test timing in the detection target circuit portion at each test operation frequency or not and decides a maximum test operation frequency at which the test can be executed, and a calculation unit that converts the maximum test operation frequency decided by the decision unit based on the temperature and the voltage measured by the measurement unit into a maximum test operation frequency at a standard temperature and a standard voltage, and calculates, based on a converted maximum test operation frequency, a variability amount which indicates degree of variability, wherein the semiconductor integrated circuit has a monitor block circuit that monitors a value used by the measurement unit to measure the temperature and the voltage, the measurement unit has an estimation unit that estimates a temperature and a voltage of where the detection target circuit portion is, every time a test is executed, based on a monitored value by the monitor block circuit which operated at a temperature and a voltage of where the detection target circuit portion is, and the calculation unit uses the temperature and the voltage estimated by the estimation unit as the temperature and the voltage measured by the measurement unit and converts the maximum test operation frequency decided by the decision unit into the maximum test operation frequency at the standard temperature and the standard voltage.

An eleventh aspect in accordance with the present invention provides a detection method for detecting degradation which occurs in a semiconductor integrated circuit or variability which occurs in pluralities of same kinds of semiconductor integrated circuits, wherein the characteristic of relation among an operation frequency, temperature and a voltage of a detection target circuit portion of the semiconductor integrated circuit is approximated by an approximation formula, the method comprising measuring temperature and voltage, using a measurement unit, deciding a maximum test operation frequency at which a test can be executed within an allowable test timing in a detection target circuit portion of the semiconductor integrated circuit, using a decision unit, and calculating a maximum test operation frequency at a standard temperature and a standard voltage using the approximation formula, using the temperature, the voltage and the maximum test operation frequency and calculating, based on the maximum test operation frequency calculated, a degradation amount which indicates degree of degradation or a variability amount which indicates degree of variability, using a calculating unit.

A twelfth aspect in accordance with the present invention provides the detection method of the eleventh aspect, wherein the semiconductor integrated circuit has n (n is an integer equal to or more than 2) monitor block circuits that monitors a value used by the measurement unit to measure the temperature and the voltage, the measuring includes measuring a measured frequency $F_i$ (i is an integer equal to or less than n) obtained as an oscillation number of times at each monitor block circuit within a predetermined time, and estimating temperature T and voltage V of where the detection target circuit portion is by calculating coefficients $\alpha_i$, $\beta$, $\alpha'_i$, and $\beta'$ in an equation (eq2).

Equation 2

$$T = \sum_{i=1}^{n} \alpha_i F_i + \beta, \quad \text{(eq 2)}$$

$$V = \sum_{i=1}^{n} \alpha'_i F_i + \beta'.$$

A thirteenth aspect in accordance with the present invention provides a program capable of causing a computer to execute the detection method of the eleventh or the twelfth aspect.

Another aspect of the present invention provides a computer-readable storage medium having the program.

The allowable test timing is an inverse of the test operation frequency. Thus, an equivalent operation is possible in use of the allowable test timing or the test operation frequency. Therefore, the judgment, by the decision unit, whether the test is executed within an allowable test timing includes the judgment based on the test operation frequency.

Effect of the Invention

According to each aspect of the present invention, the maximum test operation frequency at a standard temperature and at a standard voltage of a semiconductor device can be calculated based on the maximum test operation frequency and on measured values of temperature and voltage. Thus, the operation characteristic of a semiconductor integrated circuit under various environments can be uniformly evaluated. That is, the operation characteristic of the semiconductor integrated circuit can be judged more precisely and quantitatively without controlling the test environment. In particular, monitoring the value for measuring temperature and voltage by a monitor block circuit of the semiconductor integrated circuit makes it possible to convert the temperature and the voltage into a standard temperature and a standard voltage without any additional sensor.

Particularly, conventional test methods basically judge a semiconductor integrated circuit as normal when it satisfies a predetermined requirement and not judge it as abnormal until it fails to satisfy the predetermined requirement. Thus, it is difficult for the conventional test methods to judge the degree of normality of a semiconductor integrated circuit quantitatively and, for example, to execute procedures such as the prediction of faults of the semiconductor integrated circuits with high accuracy. This is partly due to the increase of the circuit size contrary to extreme miniaturization, because a semiconductor integrated circuit needs, for example, a plurality of parallel circuit elements to diagnosis faults by comparing them or a circuit prepared for faults such as backup circuits.

According to each aspect of the present invention, it should be noted among others that degree of degradation caused in a semiconductor integrated circuit in field can be detected uniformly and quantitatively, which leads to prediction of degradation in advance. The prediction of degradation in advance allows a provision for faults by utilizing the semiconductor integrated circuit while it operates normally or by replacing the semiconductor integrated circuits. Then, only minimum backup circuits are necessary for faults, resulting in a smaller circuit size.

In addition, according to the second aspect of the present invention, temperature and voltage are estimated based on the equation (eq1) using a plurality of measured frequencies obtained by a plurality of monitor block circuits. By this, estimation accuracy is increased compared to the estimation using a measured frequency obtained by a single monitor block circuit. Besides, the estimation using primary expression realizes a program of extremely simple procedure and extremely simple circuit design. Therefore, it is easier to compare uniformly the characteristic of the same semiconductor integrated circuits put in the environments of different temperatures and voltages.

Further, according to the third aspect of the present invention, a temperature range or a voltage range is divided into pluralities of divisions and the coefficients in the equation (eq1) are calculated for each of the divisions. Thus, it is possible to estimate temperature or voltage using more precise equations for each of the divisions.

Further, according to the fourth aspect of the present invention, the difference between the measured frequency at each time and the first measured frequency is utilized as a parameter of measured frequency in the equation (eq1). By this, it is possible to cancel the variance of measured frequency obtained by monitor block circuits, caused by production variability. Then, the deterioration of estimation accuracy caused by the variance in the equation (eq1) is suppressed and it is possible to estimate temperature and voltage with higher accuracy.

Further, according to the fifth aspect of the present invention, storing unit stores the combination of test environment and the maximum test operation frequency. Therefore, by utilizing such a history, a plurality of test results under different environments can be automatically compared.

Further, according to the sixth aspect of the present invention, it is possible to remove random noise from the maximum test operation frequency by averaging a plurality of test results, for example. Therefore, the operation characteristic of a semiconductor integrated circuit can be easily detected with higher accuracy.

Further, according to the seventh aspect of the present invention, the maximum test operation frequency of the present test can be expected at first based on the previous test. And the expected maximum test operation frequency is decreased after increased or only decreased to determine the test operation frequency at which a test is executed in order to determine the maximum test operation frequency at the present test. By this, the initial test operation frequency can be determined with high accuracy, which decreases the number of iterations in the test and test time as well as the influence on a semiconductor integrated circuit from the test. Here, "test time" means the time necessary for executing the whole test. The same goes for what follows.

Further, according to the eighth aspect of the present invention, different tests can be executed for each of different lengths of paths to be tested. Basically, the fault detection of shorter paths than the longest path is difficult in the delay tests and so on. On the other hand, degradation includes a degradation which occurs in an oxide film such as TDDB (Time Dependent Dielectric Breakdown) which breaks transistor operation when the degradation amount reaches a certain amount. This does not always occur only in a long path. By executing different tests for each of different lengths of paths, it is possible to measure the degradation amount of short paths. Besides, the test efficiency can be increased, which is significantly meaningful for a semiconductor integrated circuit after shipment whose allowable test timing is restricted to spare time because it is easier to make a proper judge based on a rapid test.

Further, according to the ninth aspect of the present invention, it is possible to execute the test often by which high degree of degradation is found. By this, it is easier to know efficiently the degree of degradation of a semiconductor integrated circuit after shipment whose allowable test timing is restricted to spare time.

Additionally, according to the tenth or eleventh aspect of the present invention, the performances of a plurality of semiconductor integrated circuits of the same kind can be compared with a uniform standard without unifying test environment.

BRIEF DESCRIPTION OF THE DRAWINGS

FIG. 4 shows an example of a constitution of log information.

MODES FOR CARRYING OUT THE INVENTION

Below, referring to figures, the embodiment of the present invention is described. However, the present invention is not restricted to this embodiment.

Embodiment

Figure 1:
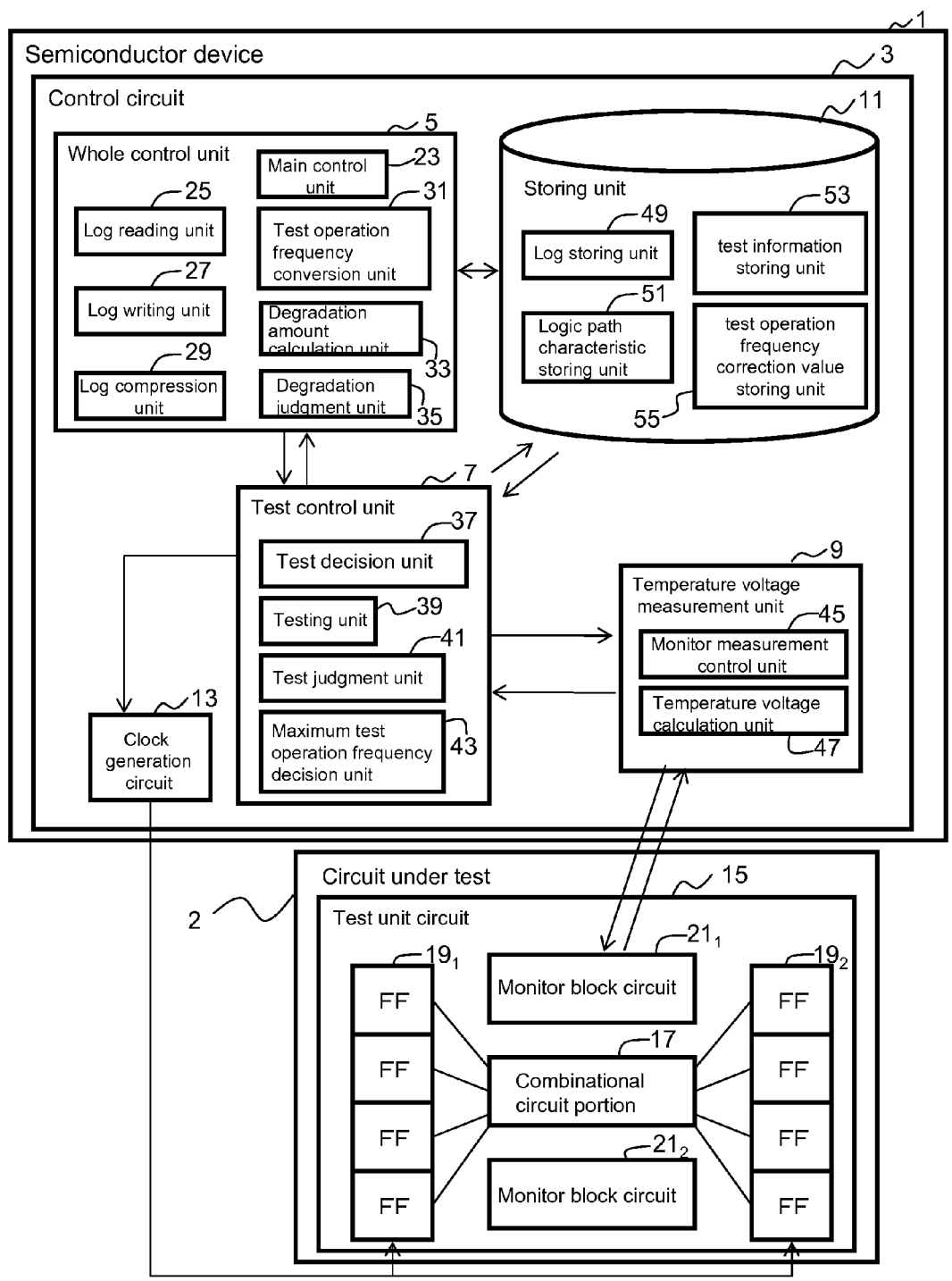
FIG. 1 shows a schematic block diagram of a semiconductor device 1 in accordance with an embodiment of the present invention.

FIG. 1 shows a schematic block diagram of a semiconductor device 1 in accordance with the embodiment of the present invention. Below, the semiconductor device 1 is briefly described.

The semiconductor device 1 is a semiconductor device which can detect the degradation of a circuit under test 2 (an example of "semiconductor integrated circuit" in CLAIMS.) The semiconductor device 1 includes a control circuit 3 which controls the test for the circuit under test 2. As described afterwards, the semiconductor device 1 may include the circuit under test 2, though the circuit under test 2 is supposed to be apart from the control circuit 3.

In general, a semiconductor logic circuit is mainly a sequential circuit. A sequential circuit includes a combinational circuit portion 17 which is composed of logic elements such as AND gates, NAND gates, OR gates, NOR gates and so on, and a flip-flop (FF) which stores the internal state of a circuit. The circuit under test 2 includes a test unit circuit 15 which is a circuit as a unit for test. The test unit circuit 15 includes the combinational circuit portion 17, a plurality of flip-flops $19_1$ and $19_2$, and a plurality of monitor block circuits $21_1$ and $21_2$ (which are examples of "monitor block circuit" in CLAIMS) which measure frequency. The test unit circuit 15 may be a logic unit such as block or module used in logic design or a logic unit which has an organized function (core.) The examples of core are a numerical operation unit, a data path unit, an IO control unit, and so on.

The control unit 3 includes a whole control unit 5 which controls the whole semiconductor device 1, a test control unit 7 which controls a test, a temperature voltage measurement unit 9 which controls the measurement of temperature and voltage changing the test operation frequency every time a test is executed (an example of "measurement unit" in CLAIMS), a storing unit 11 (an example of "storing unit" in CLAIMS) and a clock generation unit 13 which generates a clock. The control unit 3 has a plurality of control blocks such as the whole control unit 5, the test control unit 7, the temperature voltage measurement unit 9, and so on. As described below, each control block has a hierarchical structure.

The whole control unit 5 includes the main control unit 23 which controls the whole, a log reading unit 25 which reads log out, a log writing unit 27 which writes in log, a log compression unit 29 which compresses log, a test operation frequency conversion unit 31 which converts a test operation frequency at a predetermined temperature and voltage into a test operation frequency at another temperature and voltage, a degradation amount calculation unit 33 which calculates a degradation amount, and a degradation judgment unit 35 which judges degradation. Here, the combination of test operation frequency conversion unit 31 and the degradation amount calculation unit 33 is an example of "calculation unit" in CLAIMS. The test operation frequency conversion unit 31 calculates the maximum test operation frequency at a standard temperature and a standard voltage using a measured temperature, a measured voltage and a maximum test operation frequency determined by the test control unit 7. The degradation amount calculation unit 33 calculates a degradation amount which indicates the degree of degradation based on the calculated value by the test operation frequency conversion unit 31 as the maximum test operation frequency at the standard temperature and the standard voltage.

The test control unit 7 includes a test decision unit 37 which decides the test for the test unit circuit 15, a test unit 39 which execute a test, a test judgment unit 41 which judges whether the test for the test unit circuit 15 can be executed within an allowable test timing or not at each test operation frequency, and a maximum test operation frequency decision unit 43 which decides the maximum test operation frequency at which the test can be executed within an allowable test timing. Here, the combination of the test judgment unit 41 and the maximum test operation frequency decision unit 43 is an example of "decision unit" in CLAIMS.

The temperature voltage measurement unit 9 includes a monitor measurement control unit 45 which controls the measurement of the frequency of the test unit circuit 15, and a temperature voltage calculation unit 47 (an example of "estimation unit" in CLAIMS) which estimates the temperature and the voltage by calculation based on a measured frequency. Here, the "measurement" of temperature and voltage refers to the calculation of the temperature and the voltage by the temperature voltage calculation unit 47 based on the measured test operation frequency, unless it is explicitly stated otherwise. Similarly, the measured values of temperature and voltage refer to the calculated values in that manner.

The storing unit 11 includes a log storing unit 49 which stores log, a logic path characteristic storing unit 51 which stores logic path characteristic, a test information storing unit 53 which stores test information, and a test operation frequency correction value storing unit 55 which stores the correction value of a test operation frequency.

Next, the transmission of information in the semiconductor device 1 is described. The whole storing unit 5 transmits, to the test control unit 7, a test start instruction, the previous test, the initial value of a test operation frequency $F_c$ or the correction value of the present maximum operation frequency, for example. On the other hand, the test control unit 7 transmits, to the whole control unit 5, the name of a test unit, the test result at a machine cycle determined at design phase, the present maximum operation frequency $F_{MAX}$, the present test, or the measured values of temperature or voltage, for example.

Further, the whole control unit 5 and the storing unit 11 transmit log information to each other.

In addition, the test control unit 7 transmits, to the temperature voltage measurement unit 9, the start instruction or the end instruction of the measurement of temperature or voltage, for example. On the other hand, the temperature voltage measurement unit 9 transmits the measured values of temperature or voltage to the test control unit 7.

Further, the test control unit 7 transmits, for example, a test order or the correction value of the final $F_{MAX}$ to the storing unit 11. On the other hand, the storing unit 11 transmits, for example, test information to the test control unit 7.

Further, the test control unit 7 controls the clock generation circuit 13 to generate $F_c$. The clock generation circuit 13 writes in FF $19_1$ and $19_2$ at a test clock, and afterwards, loads the test pattern which transmitted through the combinational circuit portion 17 to FF $19_1$ or $19_2$ at the clock generated with test operation frequency $F_c$ (or a test timing (an example of "allowable test timing" in CLAIMS) which is the inverse of $F_c$.) The loaded test response is read out from the FF $19_1$ or $19_2$ at the test clock and transmitted to the test control unit 7. Further, the test control unit 7 transmits a test pattern to the circuit under test 2. On the other hand, the circuit under test 2 transmits a test response to the test control unit 7.

The temperature voltage measurement unit 9 transmits the start instruction or the end instruction of the frequency measurement to the monitor block circuit $21_1$ and $21_2$. On the other hand, the monitor block circuit $21_1$ and $21_2$ transmits the measured frequency to the temperature voltage measurement unit 9.

Below, referring to FIG. 2 and FIG. 3, the test flow of the circuit under test 2 using the semiconductor device 1 will be described.

Figure 2:
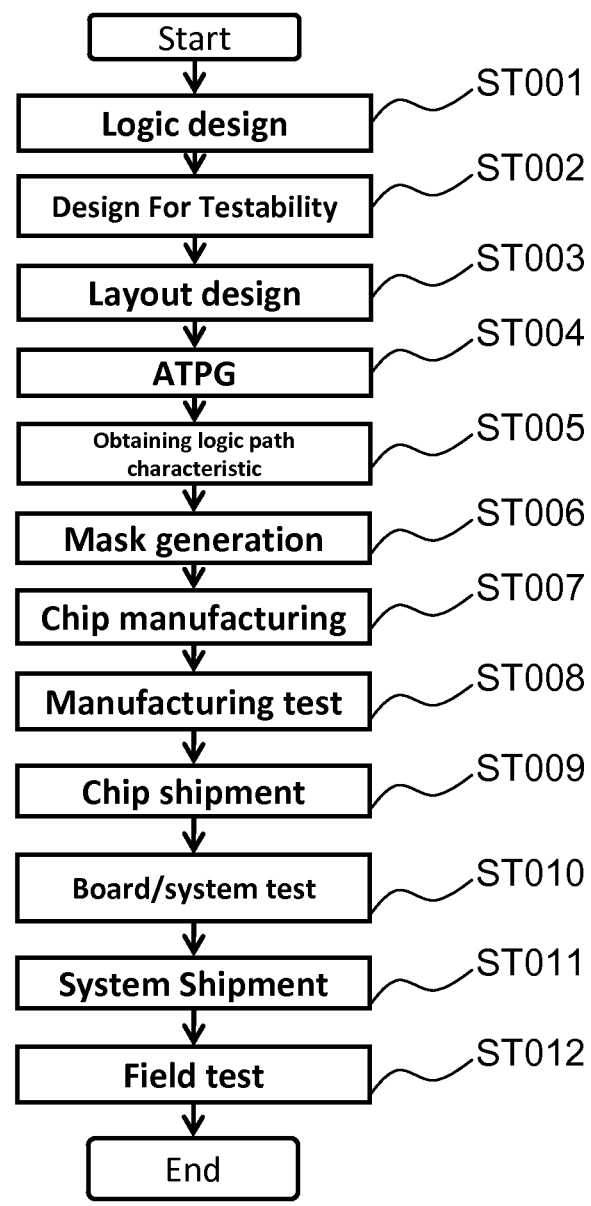
FIG. 2 illustrates a schematic flowchart showing the design flow of a circuit under test 2.

FIG. 2 illustrates a schematic flowchart showing the design flow of the circuit under test 2 using the semiconductor device 1. The design flow of FIG. 2 can be divided into the procedures to the shipment of a chip (from step ST001 to ST009), the procedures to the shipment of a system (step ST010 and ST011) and the procedure after the shipment of the system (step ST012.) In each of the divided procedures, a manufacturing test (step ST008), a board/system test (step ST010) and a field test (step ST012) are executed.

First, referring to FIG. 2, the procedures to the shipment of a chip is described. The logical design of the circuit under test 2 (step ST001) and Design For Testability (DFT) are conducted. Then, the control circuit 3 and the monitor block circuit $21_1$ and $21_2$ are added (step ST002.) Accordingly, the layout is designed (step ST003), Automatic Test Pattern Generation (ATPG) is performed to generate the seed pattern of BIST (test seed) (step ST004.) Subsequently, logic path characteristic is obtained (step ST005.) Concretely speaking, the simulation calculation of the characteristics of the temperature T and the voltage V of the longest logic path tested is performed for every test unit. Then, the coefficients of the approximation formula which approximates the characteristic of the relation of a test operation frequency to temperature and voltage are obtained. For example, the present inventors have found that frequency has a good linearity to temperature and voltage in the temperature range when LSI is used. Thus, the coefficients a, b, c, d, and e of the approximation equation (1) whose variants are temperature T and voltage V will be calculated. Otherwise, the equation described later which is derived from the equation (1) may be used. Then, a mask is generated (step ST006), and a chip is manufactured (step ST007.) Subsequently, the manufacturing test is executed (step ST008.) And the chip is shipped (step ST009.)

Equation 3

$$F(T,V)=(aT+b)(cV+d)+e \qquad (1)$$

The shipped chips are built into a board or a system and a test is executed (step ST010.) Then, the test unit 39 executes the first test and the initial (before degradation) $F_{MAX}$ is obtained, and the log writing unit 27 writes the $F_{MAX}$ in the storing unit 11. Subsequently, the system is shipped (step ST011.)

After the shipment of the system, a field test is executed utilizing spare time (the time when the system is not working, for example) (step ST012.) This field test is in general executed for every test unit circuit. This is because the frequency is different for different test unit circuit 15 or because the diagnosis resolution capability should be kept.

Figure 3:
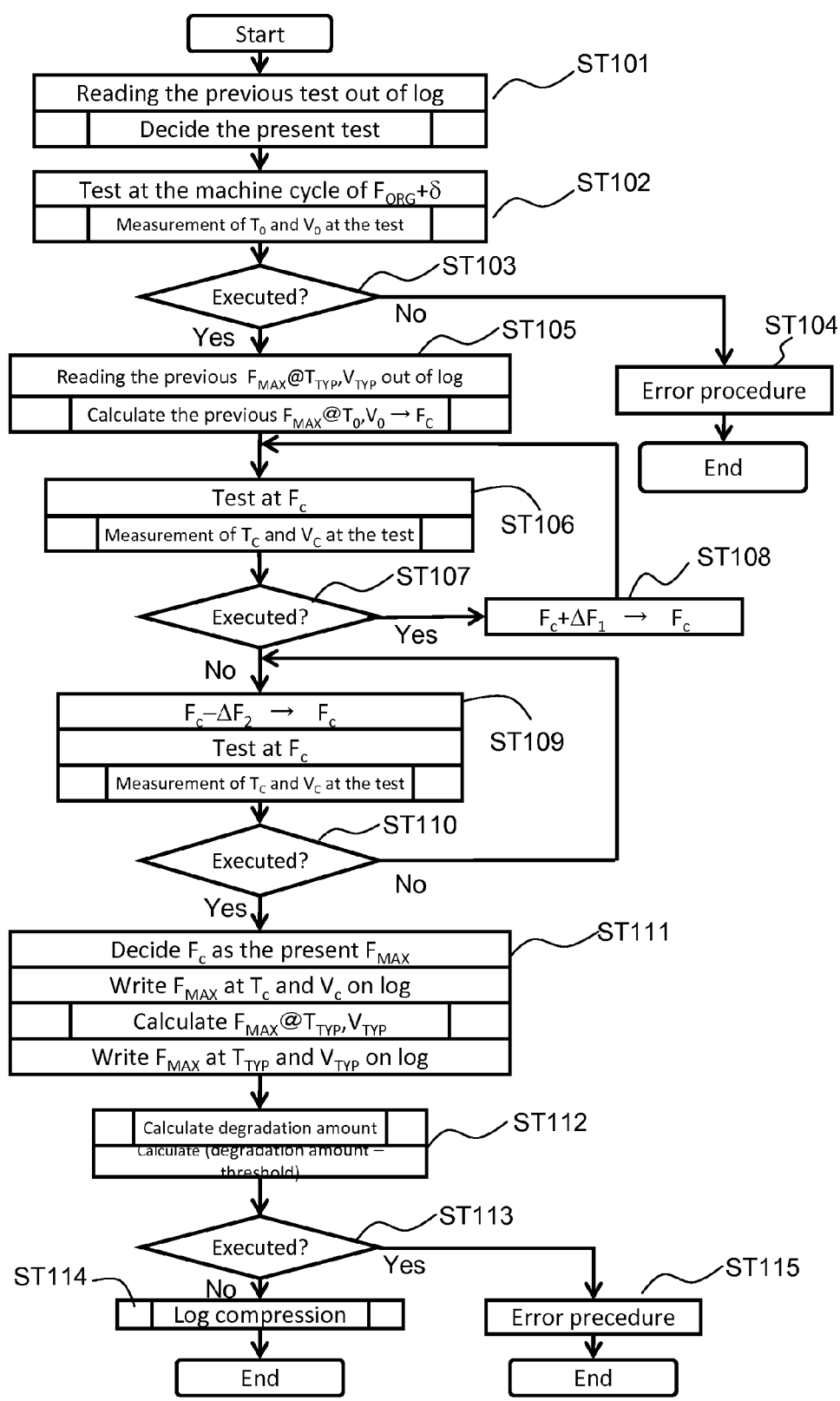
FIG. 3 illustrates a schematic flowchart showing a field test in FIG. 2.

Next, referring to FIG. 3, a specific example of a field test at step ST012 in FIG. 2 is described. Here, as a typical example of utilizing the spare time of a system, the power-on/off test which is executed at system start/shutdown is described.

Referring to FIG. 3, when the power-on/off test is started, the log reading unit 25 reads the previous test out of the log storing unit 49. The whole control unit 5 transmits the previous test to the test control unit 7, and the test decision unit 37 decides the test which is determined at the previous power-on/off test as the present test (step ST101.) Then, the test unit 39 executes the test at the machine cycle $F_{org}+\delta$ which is decided at design phase and at which the test operation is ensured. In addition, the temperature measurement unit 9 makes the monitor block circuit $21_1$ and $21_2$ measure the initial temperature ($T_0$) and the initial voltage ($V_0$) at the test. Here, $\delta$ is a minimum operation margin (step ST102.)

Then, the test judgment unit 41 judges whether the test at $F_{org}+\delta$ can be executed or not (step ST103.) If the test at this stage cannot be executed, the test unit 39 executes an error procedure (step ST104) and the flow ends. If the test can be executed, the log reading unit 25 reads the previous $F_{MAX}$ at a standard temperature ($T_{TYP}$) and a standard voltage ($V_{TYP}$) out of log. In addition, the test operation frequency conversion unit 31 calculates the correction value of the Previous $F_{MAX}$ at $T_0$ and $V_0$ which are the present conditions, and a test operation frequency ($F_c$) is obtained (step ST105.) This $F_c$ is the first candidate of the maximum test operation frequency of the present test. Here, by starting from the previous $F_{MAX}$, it is intended to decrease the number of iterations in the test. Additionally, the temperature and voltage of the present test can vary from the previous test. That is why the correction values are calculated. If the temperature and voltage of the present test is the same with those of the previous test, the correction values need not be calculated in the step ST105.

Next, the test unit 39 executes a test at the obtained test operation frequency $F_c$, and the temperature voltage measurement unit 9 controls monitor block circuits $21_1$ and $21_2$ to measure the temperature ($T_c$) and the voltage ($V_0$) at the test (step ST106.) The test judgment unit 41 judges whether the test can be executed at $F_c$ or not (step ST107.) If the test can be executed, the test unit 39 increments the test operation frequency $F_c$ into $F_c+\Delta F_1$ as a new $F_c$ (step ST108), and goes back to step ST106 to execute a test at the new $F_c$ again. This procedure is repeated until the test cannot be executed. It is quite unlikely that the performance at present is improved than that at the previous test. If the test could be executed at a higher test operation frequency than that of the previous test, it is mainly due to a measurement error. The error $\Delta F_1$ should be designed so that the number of repeating this procedure is restricted to one or so if any. If the test cannot be executed in step ST107, the procedure goes to step ST109.

Next, in the step ST109, the decrease of the maximum test operation frequency due to degradation is obtained. The test unit 39 executes a test setting $F_c - \Delta F_2$ as a new $F_c$. The temperature voltage measurement unit 9 makes the monitor block circuits 21$_1$ and 21$_2$ measure the temperature ($T_c$) and the voltage ($V_c$) at the test. Then, the test judgment unit 41 judges whether the test can be executed at $F_c$ or not (step ST110.) If the test cannot be executed, the procedure goes back to step ST109 to set $F_c - \Delta F_2$ as a new $F_c$ again, and the procedures will be repeated until the test can be executed. If the test can be executed, the procedure goes to step ST111.

Then, in step ST111, the maximum test operation frequency decision unit 43 decides $F_c$ as the present $F_{MAX}$ and the test control unit 7 transmits the present $F_{MAX}$ and the present test to the whole control unit. In addition, the log writing unit 27 writes $F_{MAX}$ at $T_c$ and $V_c$ of the present test on log. The test operation frequency conversion unit 31 converts $F_{MAX}$ into the test operation frequency at the standard temperature ($T_{TYP}$) and the standard voltage ($V_{TYP}$) $F_{MAX}@T_{TYP}$, $V_{TYP}$, and the log writing unit 27 writes it on log. Subsequently, the degradation amount calculation unit 33 calculates the present degradation amount referring to log history, and a threshold of an allowable degradation amount is subtracted from the calculated degradation amount (step ST112.) Then, the test decision unit 41 judges whether the obtained value is positive or not (step ST113.) If the obtained value is not positive, the log compression unit 29 compresses log (step ST114) and the flow is ended. If the obtained value is positive, the test unit 39 executes an error procedure (step ST115), and the flow is ended.

The degradation judgment unit 35 may judge as degradation at a single error or at consecutive errors from several field tests, according to system requirements. If several field tests are executed, the test unit 39 executes procedures preparing for the next test. Concretely speaking, the procedures of deciding the next test, reading a test pattern out of the storing unit 11, and so on are executed.

Next, referring to FIG. 4, the constitution of log information will be described. FIG. 4 shows an example of a constitution of log information.

Log is referred to check the history of measured values and so on in order to measure the maximum frequency efficiently. And log is also referred to perform the operation of removing random noise by analyzing the random noise of measurement statistically from the maximum test operation frequencies obtained from each of several tests to judge degradation. Here, an example of the random noise is rounding off error associated with measurements. Further, log is also referred to give a feedback of the degradation history information to design phase or manufacturing phase.

The information of log may include, for example, raw data of measurement and processed information to decrease the overhead of every procedure. Concretely speaking, as shown in FIG. 4, for example, the log may include test time, test unit (the name of core and the like), test content, the maximum test operation frequency ($F_{MAX}$), the temperature at the test ($T_c$), the voltage at the test ($V_c$), the converted maximum test operation frequency at the standard temperature and the standard voltage ($F_{MAX}@T_{TYP}$, $V_{TYP}$.) It may include the present test operation frequency ($F_c@T_c$, $V_c$.)

Here, the test contents stored in log make it possible to utilize the test results even if test content is different every time. The test time is included mainly for analysis, and it is not the necessary information for the degradation detection flow in accordance with the embodiment of the present invention. Additionally, the maximum test frequencies are converted into the ones at the standard temperature and the voltage because that makes easier to compare the results of each test. The standard temperature is 27 degrees Celsius, for example, but another temperature can be the standard temperature. If there is enough time for test, $F_{MAX}@T_{TYP}$, $V_{TYP}$ can be calculated based on the previous $F_{MAX}$ at every test, instead of write $F_{MAX}@T_{TYP}$, $V_{TYP}$ in log.

Before history information of the log is increased too much, the log compression unit 29 compresses the log to compress the information. Here, old information unnecessary for degradation judgment other than the information at shipment can be removed. Thus, for example, if $F_{MAX}@T_{TYP}$, $V_{TYP}$ is the same with that of the previous test, it may not be stored, that is, $F_{MAX}@T_{TYP}$, $V_{TYP}$ may be written in log only when it changes. When there is no change, it is enough to write the fact that there is no change in log, which can decrease the amount of data.

The clock generation circuit 13 can compress test timing by moving the specified clock among test clocks while keeping the reference external clock.

Figure 5:
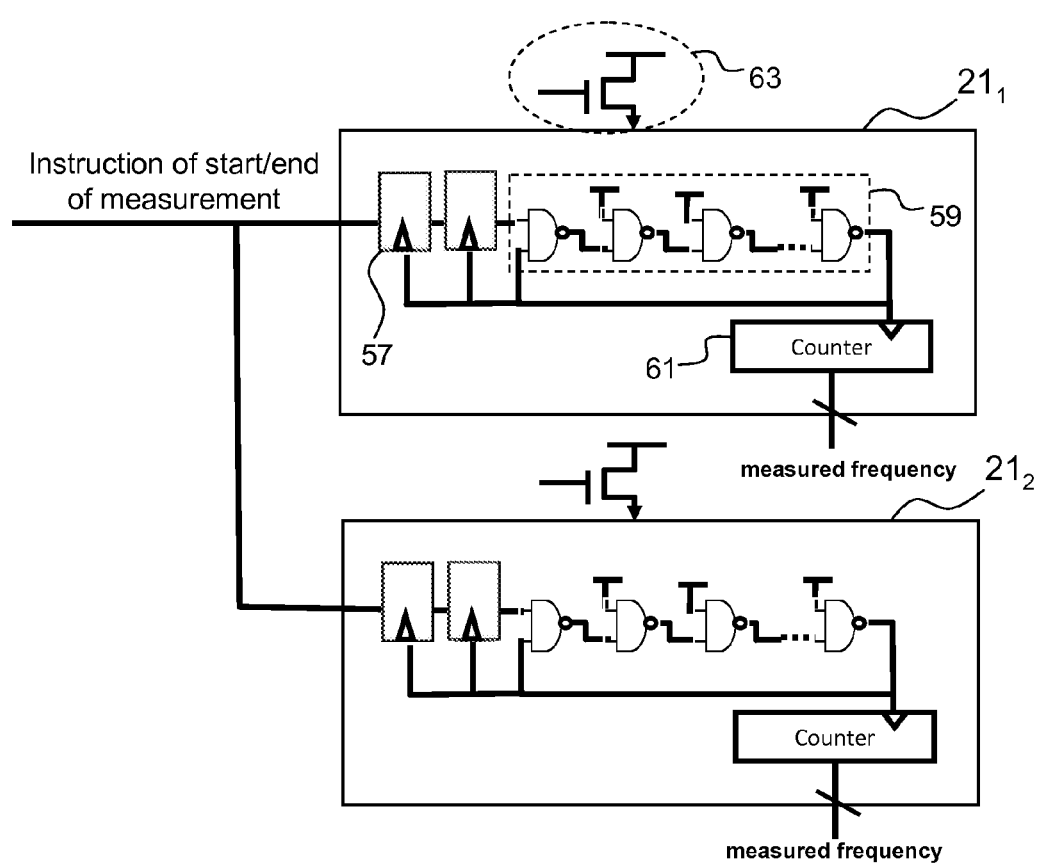
FIG. 5 illustrates an example of a circuit diagram of monitor block circuit $21_1$ and $21_2$.

Next, referring to FIG. 5, the frequency measurement by the monitor block circuits 21$_1$ and 21$_2$ is described. FIG. 5 illustrates an example of a circuit diagram of monitor block circuits 21$_1$ and 21$_2$.

Referring to FIG. 5, the monitor block circuit 21$_1$ includes a FF 57 which stores a value, a ring oscillator (RO) 59 which oscillates according to temperature and voltage, and a counter 61 which measures the number of oscillation of RO 59. The monitor block circuit 21$_1$ receives the start or the end instruction of measurement, count the number of oscillation within designated time (integral multiple of the clock of $F_{org}$), and outputs the measured frequency measured by the counter 61.

In order to decrease the variability of measured frequencies, the test unit circuit 15 may include not only the monitor block circuit 21$_1$ but also a similarly constituted monitor block circuit 21$_2$, and the number of steps of ROs 59 included in each of the monitor block circuit 21$_1$ and 21$_2$ may be increased. Here, the circuit of RO 59 may be different from NAND circuits or NOT circuits. Further, as shown in FIG. 5, it is possible to keep the RO 59 from degradation while the monitor block circuits 21$_1$ and 21$_2$ are not used, by adding a power cut circuit 63 which disconnects power while not in use to each of the monitor block circuit 21$_1$ and 21$_2$.

Still, the measured frequency obtained from the monitor block circuit may include the variance $\delta F_i$ derived from manufacturing variability. So, the temperature voltage measurement unit 9 estimates the temperature T and the voltage V of the detection target circuit portion by using a difference frequency which is the difference between the measured frequency and the first measured frequency: $\Delta F_i = (F_i + \delta F_i) - (F_{i0} + \delta F_{i0}) = (F_i - F_{i0}) + \delta F_{i0})$, instead of using the measured frequency $F_i$. By this, the influence of the variance $\delta F_i$ derived from manufacturing variability is decreased, resulting in the estimation of temperature and voltage with higher accuracy.

Figure 6:
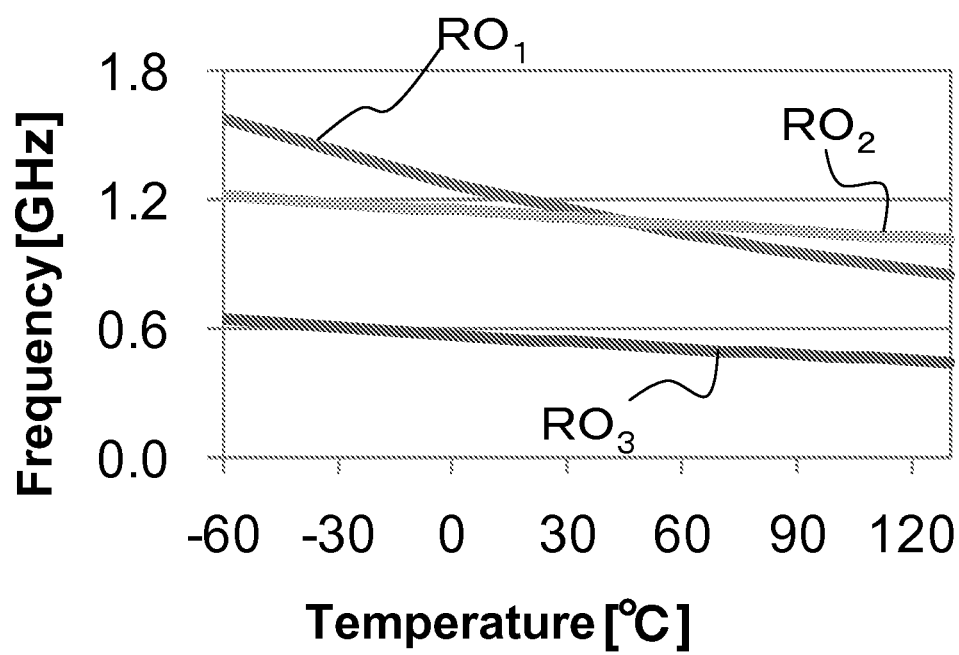
FIG. 6 illustrates an example of frequency characteristic to temperature of RO 59.

Below, referring to FIG. 6, the measurement of temperature and voltage with RO 59 at test is described. FIG. 6 illustrates an example of frequency characteristic to temperature of RO 59.

Referring to FIG. 6, 3 kinds of ring oscillators $RO_1$, $RO_2$ and $RO_3$ has different change ratios of frequency to the change of temperature and voltage. It is possible to estimate temperature and voltage by using such a plurality of ROs for measurement. Now, the temperature T and the voltage V are estimated based on the following equation (2), for example, using the frequencies measured by the pluralities of RO 59, as in the case of using an approximation equation (1). Here, $a_1$, $b_1$, $c_1$, $d_1$, $e_1$, and the like are known parameters which are determined for each RO. These parameters are already obtained in step ST005 in FIG. 2 by the simulation using multiple regression analysis, for example. $F_1$, $F_2$, and $F_3$ are the frequencies measured by each RO. Thus, the temperature $T_c$ and the voltage $V_c$ at test can be obtained from the equation (2). Here, the equation (1) or the equation (2) may be a sectioned function (that is, the function is divided according to the range of temperature and voltage and the coefficients are calculated for every divided range) in order to increase the accuracy of approximation.

Equation 4

$$\left.\begin{aligned} F_1(T, V) &= (a_1 T + b_1)(c_1 V + d_1) + e_1 \\ F_2(T, V) &= (a_2 T + b_2)(c_2 V + d_2) + e_2 \\ F_3(T, V) &= (a_3 T + b_3)(c_3 V + d_3) + e_3 \end{aligned}\right\} \quad (2)$$

The equation (2-1) is obtained from the equations of $F_1$ and $F_2$ in the equation (2). Similarly, the equation (2-2) is obtained from the equations of $F_2$ and $F_3$ in the equation (2). Then, the equation (2-3) is obtained. Besides, the equation (2-4) holds because ROs with different characteristic are used. Finally, the temperature T and the voltage V are expressed by the equation (2-5). That is, the temperature T and the voltage V are approximated by a linear expression of the measured frequency $F_i$. The equation (eq1) is a general expression of the equation (2-5)

Equation 5

$$a_2 c_2 F_1 - a_1 c_1 F_2 = a_1 a_2 (c_2 d_1 - c_1 d_2) T + (a_2 b_1 - a_1 b_2) c_1 c_2 V + (a_2 b_1 c_2 d_1 - a_1 b_2 c_1 d_2) + (a_2 c_2 e_1 - a_1 c_1 e_2) = a_1' T + b_1' V + c_1' \quad (2\text{-}1)$$

$$a_3 c_3 F_2 - a_2 c_2 F_3 = a_2' T + b_2' V + c_2' \quad (2\text{-}2)$$

$$\begin{bmatrix} a_2 c_2 F_1 - a_1 c_1 F_2 \\ a_3 c_3 F_2 - a_2 c_2 F_3 \end{bmatrix} = \begin{bmatrix} a_1' \\ a_2' \end{bmatrix} T + \begin{bmatrix} b_1' \\ b_2' \end{bmatrix} V + \begin{bmatrix} c_1' \\ c_2' \end{bmatrix} = \begin{bmatrix} a_1' & b_1' \\ a_2' & b_2' \end{bmatrix} \begin{bmatrix} T \\ V \end{bmatrix} + \begin{bmatrix} c_1' \\ c_2' \end{bmatrix} \quad (2\text{-}3)$$

$$\begin{vmatrix} a_1' & b_1' \\ a_2' & b_2' \end{vmatrix} \neq 0 \quad (2\text{-}4)$$

$$\begin{bmatrix} T \\ V \end{bmatrix} = \begin{bmatrix} a_1' & b_1' \\ a_2' & b_2' \end{bmatrix}^{-1} \begin{bmatrix} a_2 c_2 F_1 - a_1 c_1 F_2 \\ a_3 c_3 F_2 - a_2 c_2 F_3 \end{bmatrix} + \begin{bmatrix} a_1' & b_1' \\ a_2' & b_2' \end{bmatrix}^{-1} \begin{bmatrix} c_1' \\ c_2' \end{bmatrix} \quad (2\text{-}5)$$

The present inventors have confirmed by simulation that temperature and voltage can be approximated with higher accuracy by using a plurality of RO 59. The simulation result by which the coefficients are obtained using a plurality of ROs 59 is shown in Table 1. Table 1 (a) is the simulation result of the case of a single RO. Table 1 (b) is the simulation result of the case of two ROs. Table 1 (c) is the simulation result of the case of three ROs. The figures in the table are the maximum value (Max), the minimum value (Min) and the standard deviation (StdDev) of estimated error of temperature and voltage. It can be seen that the error is much smaller when two ROs are used than that when only one RO is used. For example, the standard deviation of temperature in case of a RO is 24.43 while that in case of two ROs is 9.89 at minimum. Further, it is also shown that the error is still smaller in case of three ROs.

TABLE 1

(a)

| | | F1 | | | |
|---|---|---|---|---|---|
| 1 RO | V | −60~130 | −60~0 | 0~70 | 70~130 |
| Max | 0.25 | 54.31 | 29.17 | 36.28 | 34.16 |
| Min | −0.26 | −44.21 | −30.23 | −35.99 | −35.00 |
| StdDev | 0.13 | 24.43 | 14.59 | 17.04 | 17.38 |

| | | F2 | | | |
|---|---|---|---|---|---|
| 1 RO | V | −60~130 | −60~0 | 0~70 | 70~130 |
| Max | 0.25 | 52.16 | 28.08 | 35.40 | 33.86 |
| Min | −0.26 | −41.90 | −29.02 | −35.06 | −34.69 |
| StdDev | 0.13 | 23.28 | 14.04 | 16.60 | 17.14 |

| | | F3 | | | |
|---|---|---|---|---|---|
| 1 RO | V | −60~130 | −60~0 | 0~70 | 70~130 |
| Max | 0.25 | 51.88 | 27.89 | 35.27 | 33.84 |
| Min | −0.26 | −41.49 | −28.77 | −34.89 | −34.62 |
| StdDev | 0.13 | 23.09 | 13.93 | 16.53 | 17.11 |

(b)

| | | F1-F2 | | | |
|---|---|---|---|---|---|
| 2 ROs | V | −60~130 | −60~0 | 0~70 | 70~130 |
| Max | 0.08 | 24.15 | 3.40 | 5.08 | 4.97 |
| Min | −0.05 | −15.11 | −4.57 | −4.75 | −4.09 |
| StdDev | 0.03 | 10.23 | 2.29 | 2.59 | 2.54 |

| | | F1-F3 | | | |
|---|---|---|---|---|---|
| 2 ROs | V | −60~130 | −60~0 | 0~70 | 70~130 |
| Max | 0.08 | 24.94 | 3.22 | 4.85 | 5.19 |
| Min | −0.05 | −13.88 | −4.41 | −4.86 | −4.78 |
| StdDev | 0.03 | 9.89 | 2.17 | 2.52 | 2.73 |

| | | F2-F3 | | | |
|---|---|---|---|---|---|
| 2 ROs | V | −60~130 | −60~0 | 0~70 | 70~130 |
| Max | 0.16 | 32.25 | 6.20 | 23.32 | 14.36 |
| Min | −0.14 | −15.55 | −6.01 | −7.18 | −14.66 |
| StdDev | 0.06 | 10.37 | 2.80 | 5.13 | 6.14 |

(c)

| | | F1-F2-F3 | | | |
|---|---|---|---|---|---|
| 3 ROs | V | −60~130 | −60~0 | 0~70 | 70~130 |
| Max | 0.07 | 27.21 | 3.51 | 4.75 | 4.74 |
| Min | −0.05 | −13.36 | −4.42 | −4.85 | −4.05 |
| StdDev | 0.02 | 9.57 | 2.14 | 2.52 | 2.50 |

Further, the present inventors confirmed by simulation that temperature and voltage can be approximated with higher accuracy by using divided functions. The simulation result is shown in Table 2. Table 2 indicates the result of simulation where the coefficients of estimation equation are calculated for each divided range of temperature, and temperature and voltage are estimated. It is shown that the estimation error in the case that temperature and voltage are estimated with temperature range divided into several ranges is much smaller than that in the case that the temperature range is not divided.

For example, the error of the average value of estimated temperatures decreased from 8.3 degrees Celsius to 1.8 degrees Celsius, less than ¼. And the error of the average value of estimated voltages decreased from 15.0 mV to 5.2 mV, around ⅓. As this, the estimation error of estimating temperature using equation can be smaller when the temperature range or the voltage range is divided. Similarly, the estimation error of estimating voltage using equation can be smaller when the temperature range or the voltage range is divided. The result of the simulation where temperature range from minus 60 degrees Celsius to 130 degrees Celsius is divided into three ranges is shown in Table 1, too.

TABLE 2

| Method | Estimation error | |
|---|---|---|
| | Average | Maximum |
| Temperature | | |
| Without division | 8.3° C. | 23.3° C. |
| 3 division | 1.8° C. | 4.2° C. |
| Voltage | | |
| Without division | 15.0 mV | 45.2 mV |
| 2 division | 14.6 mV | 44.9 mV |
| 3 division | 5.2 mV | 21.7 mV |

Next, the maximum test frequency at the temperature and the voltage at test, $F_{MAX}@T_c, V_c$, is converted into the maximum test frequency at the standard temperature and the standard voltage, $F_{MAX}@T_{TYP}, V_{TYP}$, for comparison. First, $F_{MAX}@T_c, V_c$ is expressed by the following equation (3). Here, the equation (4) is deformed into the equation (5) using the equation (1), and the equation (5) is deformed into the equation (6) using the equation (3). The first term of the equation (6) is a measured value $F_{MAX}@T_c, V_c$, and $F_{MAX}@T_{TYP}, V_{TYP}$ can be obtained by calculating the second, the third and the fourth terms. Typically, the second term is vanishingly small. Thus, as shown in the equation (6-2), the maximum test frequency at the temperature and the voltage at test is expressed by a linear equation of increment of temperature and voltage. Therefore, the conversion with high accuracy can be realized by designing the program or circuit of very simple procedures.

Equation 6

$$F_{MAX}@T_C, V_C = F_{MAX}(T_C, V_C) = (aT_C + b)(cV_C + d) + e \quad (3)$$

$$F_{MAX}@T_{TYP}, V_{TYP} = F_{MAX}(T_{TYP}, V_{TYP}) \quad (4)$$

$$= (aT_{TYP} + b)(cV_{TYP} + d) + e \quad (5)$$

$$= F_{MAX}@T_C, V_C + ac(T_{TYP}V_{TYP} - T_CV_C) + \quad (6)$$
$$ad(T_{TYP} - T_C) + bc(V_{TYP} - V_C)$$

$$\approx F_{MAX}@T_C, V_C + ad(T_{TYP} - T_C) +$$
$$bc(V_{TYP} - V_C) \quad (6-2)$$

Next, the calculation of the degradation amount in step ST112 of FIG. 3 is described. The degradation amount is calculated using the same test on the same unit circuit 15. Every measured degradation amount should be corrected because it includes random measurement error (half of measurement resolution ∈.) Here, two correction methods are exemplified.

The first correction method is calculating the average of errors in the tests of the latest N times, and the obtained average error can be decreased to $\in/N^{1/2}$. If degradation is advancing quickly, the degradation may be underestimated because the weight of present error is small. However, the circuit under test 2 degrades extremely slowly and this correction method works well. For example, if N equals to or more than 5, the increase and decrease of the degradation amount is restricted, resulting in the degradation judgment with high accuracy.

The second correction method is calculating the average of errors in the tests of consecutive N times around a test in the past, and the obtained average error can also be decrease to $\in/N^{1/2}$. By correcting the present degradation amount using the first correction method and also correcting the second correction method can realize even more accurate degradation judgment.

Below, three methods for degradation judgment in the flow of FIG. 3 will be described.

The first degradation judgment method is judging degradation when the design operation margin decreased to the threshold limit due to delay degradation, as expressed the following equation (7).

Equation 7

$$F_C@T_{TYP}, V_{TYP} \leq F_{ORG} - \delta \quad (7)$$

The second degradation judgment method is judging degradation when the delay degradation amount reaches or exceeds a certain threshold.

The third degradation judgment method is judging, using the equation (7), malfunction at system speed or at the speed of (system speed−α) due to an unspecified reason.

Below, the preparation of test patterns for observing delay degradation amount exhaustively will be described.

Generally, the test which targets at a long path including many logic elements takes time but such a single test can test many logic elements. And as for transition faults by which signals that is not expected are output, it is possible to execute tests for short paths for detecting faults of logic elements not included in the long paths at the same time with tests for the long paths.

However, as for delay faults, a single test can detect the delay of only the longest path which is rate-limiting. It is difficult to detect the delay of shorter paths to be tested at the same time. Here, the following is true for path delays.

The path delay to be tested by a test is assumed to be $T_{pd1} \ldots T_{pdn}$. And it is possible to observe max $(T_{pd1}, T_{pdn})$ before degradation. After degradation, assuming $\Delta_i$ as the degradation amount, it is possible to observe max $(T_{pd1}+\Delta_1, \ldots, T_{pdn}+\Delta_n)$.

Because the delay value $\Delta_i$ varies by path, the following equations from (8) through (11) hold.

Equation 8

$$\max \Delta_i \geq \{\max(T_{pd1} + \Delta_1, \ldots, T_{pdn} + \Delta_n) - \max(T_{pd1}, \ldots, T_{pdn})\} \quad (8)$$

Assuming $\max \Delta_i = \Delta_j$,

-continued $$\max\Delta_i = (T_{pdj} + \Delta_j) - T_{pdj} \quad (9)$$
$$\leq \{\max(T_{pd1} + \Delta_1, \ldots, T_{pdn} + \Delta_n) - \min(T_{pd1}, \ldots, T_{pdn})\} \quad (10)$$
$$\leq \{\max(T_{pd1} + \Delta_1, \ldots, T_{pdn} + \Delta_n) - \quad (11)$$
$$\max(T_{pd1}, \ldots, T_{pdn})\} - \{\max(T_{pd1}, \ldots, T_{pdn}) - \min(T_{pd1}, \ldots, T_{pdn})\}$$

The first term of the equation (11) can be observed from the difference of measured values. Therefore, if the second term which is the variability of path delay values in the test is small, max$\Delta$ can be estimated with high accuracy.

Thus, a plurality of test may be prepared for each of different lengths of paths to be tested. For example, the first test is executed for a group of paths with the largest delays (the paths with lengths whose path delays $T_{pdi}$ equals to or more than $T_{sys} - \delta_1$ and equals to or less than $T_{sys}$.) Here, $T_{sys}$ is the system speed. Subsequently, the second test is executed for a group of paths with the second largest delays (the paths with lengths whose path delays equals to or more than $T_{sys} - \delta_2$ and equals to or less than $T_{sys} - \delta_1$.) Similarly, the third test is executed for a group of paths with the third largest delays (the paths with lengths whose path delays equals to or more than $T_{sys} - \delta_3$ and equals to or less than $T_{sys} - \delta_2$.)

As described above, by executing different tests for groups of paths with similar path lengths, delay degradation amount can be exhaustively observed including delay degradation of short paths. As a TDDB (Time Dependent Dielectric Breakdown) which is representative of degradation of gate oxide film, it is known that a gate oxide film is broken after delay amount is increased by certain degree. In such a case, logic operation is broken even if it is not on a long path. Therefore, it is important to observe the increase of delay including that of short paths in advance.

In addition, test time is restricted in field tests. Tests should be decided according to the restricted test time. Here, defects such as system errors and the like other than the above described TDDB is easy to occur in long paths. Thus, path lengths can be useful. If there is only small test time, tests may be executed only for important elements by executing the tests for long paths. If there is much test time, tests may be executed exhaustively for many elements by executing the tests including the ones for shorter paths. As this, by executing tests for the group of adequate path lengths, it is still easier to utilize the restricted test time efficiently. Such a promotion of efficiency especially works well if it can be judged that TDDB is not likely to occur because of good manufacturing process.

Further, it is possible to execute a test frequently at the part where degradation is advancing by referring to the history written in log. The test time of field tests are restricted to the spare time when a user is not using. Thus, it is very effective to change test and/or test order according to allowable test timing and/or degradation amount for preventing faults due to degradation effectively, combined with executing a test within a restricted time as described above.

Figure 7:
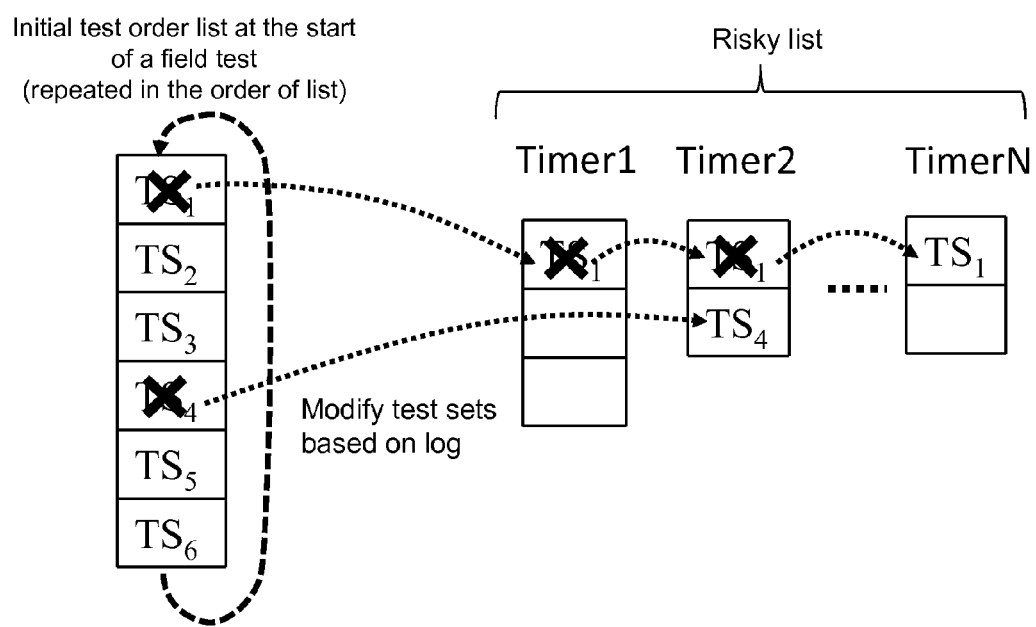
FIG. 7 illustrates a schematic diagram showing an example of test order modification method using history in log.

Below, referring to FIG. 7, it is described to execute tests frequently at the part where degradation is advancing referring to the history in log. FIG. 7 illustrates a schematic diagram showing an example of test order modification method using history in log.

Referring to FIG. 7, the whole test set is divided into several test sets, $TS_1$, $TS_2$ and so on. When a field test is started, the order of a test list is already determined as an initial test order list. The tests are executed repeatedly according to the initial test order list. The frequency of executing tests is controlled by a timer according to degree of degradation. For example, if there are 8 kinds of test sets and 3 test sets are executed per a test, according to the initial test order list, $TS_1$, $TS_2$ and $TS_3$ are executed in the first test, $TS_4$, $TS_5$ and $TS_6$ are executed in the second test, $TS_7$, $TS_8$ and $TS_1$ are executed in the third test, and $TS_2$, $TS_3$ and $TS_4$ are executed in the fourth test. As this, test sets are executed repeatedly according to the order of the list.

Here, it is assumed that degradation trend is found by $TS_1$ and $TS_4$, and that the degradation found by $TS_1$ is especially advancing. Then, $TS_1$ and $TS_4$ are stored in the risky list and updated based on the history in log. There are a plurality of risky lists and the test frequency of each risky list is controlled by a timer. The timer is prepared to execute tests in a risky list which has a more highly risky test set at shorter intervals. When executing a field test, $TS_1$ and $TS_4$ stored in the risky list are preferentially executed at every allowable test timing controlled by the timer breaking in the initial test order list. Especially, as the degradation found by $TS_1$ is advancing, $TS_1$ is more frequently executed than $TS_4$. As a result, after modification, for example, $TS_1$, $TS_4$ and $TS_2$ are executed in the first test, $TS_1$, $TS_3$ and $TS_5$ are executed in the second test, $TS_1$, $TS_4$ and $TS_6$ are executed in the third test, and $TS_1$, $TS_4$ and $TS_8$ are executed in the fourth test. As this, test sets are executed according to the modified test order. By modifying the test order according to the degree of degradation, it is possible to execute tests effectively within the restricted field test time and to prevent the defect from occurring due to degradation.

Here, a plurality of values may be adopted as the threshold of test in step ST103 or ST113 in FIG. 3. For example, two threshold values for judgment may be adopted, one for the judgment of warning and the other for judgment of error. By adopting a plurality of thresholds, it is possible to operate practically even if there is restricted log information.

Additionally, the error may be output in the step ST113 in FIG. 3 with a judgment method other than the judgment method based on a threshold.

Figure 8:
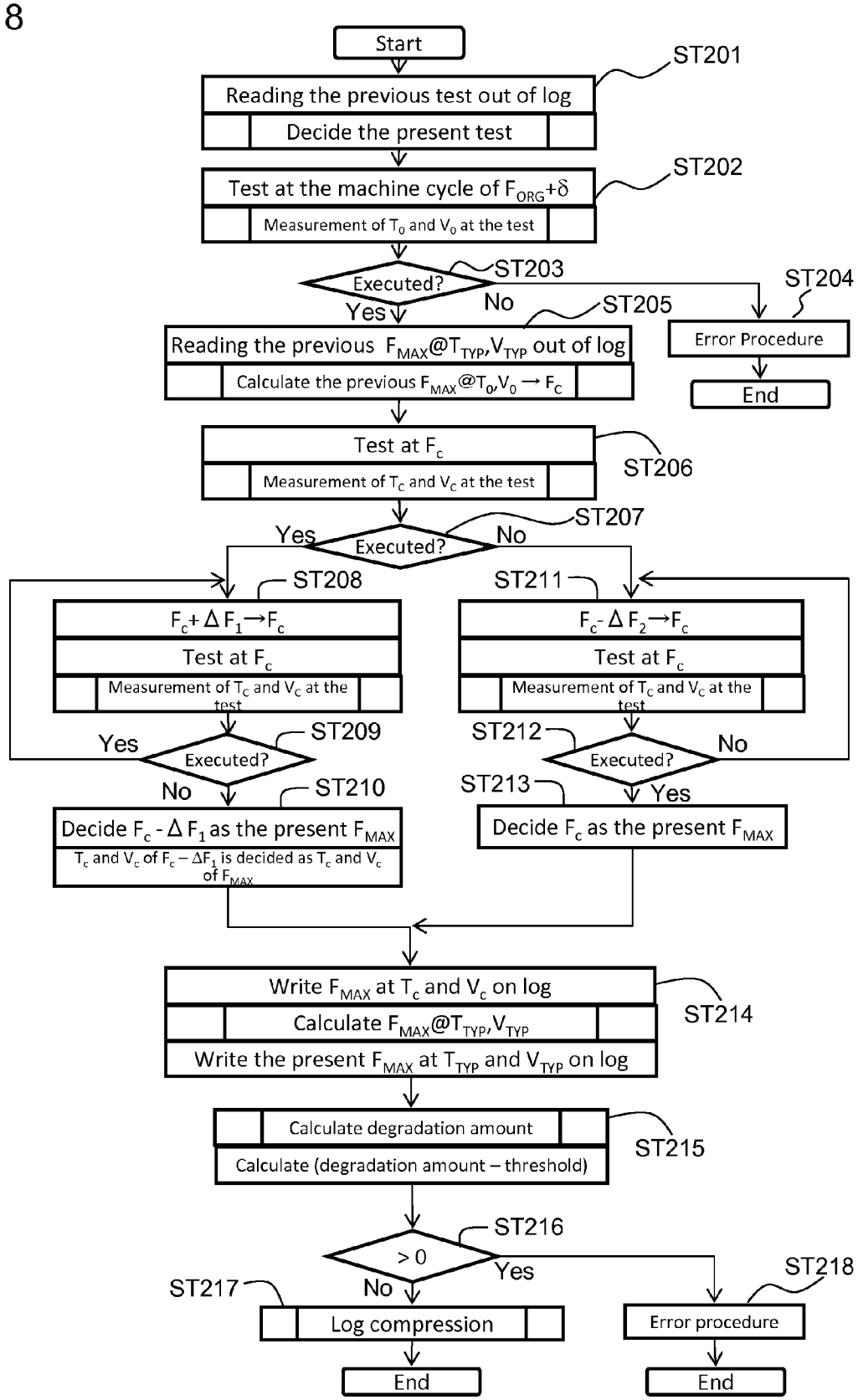
FIG. 8 illustrates a schematic diagram showing another example of field test which is partly modified from that of FIG. 3.

Further, a part of procedures in the flowchart of FIG. 3 may be modified into the procedures shown in FIG. 8. FIG. 8 illustrates a schematic diagram showing another example of field test which is partly modified from that of FIG. 3.

Referring to FIG. 8, the procedures from step ST107 through ST112 in the flowchart of FIG. 3 may be modified into the procedures from step ST207 through ST215 shown in FIG. 8. First, in step ST207 which corresponds to step ST107, the test judgment unit 41 judges whether a test at $F_c$ can be executed or not.

If a test can be executed in the step ST207, the test unit 39 increments the test operation frequency $F_c$ to $F_c + \Delta F_1$ as a new $F_c$ and a test is executed. Also, the temperature voltage measurement unit 9 controls the monitor block circuits $21_1$ and $21_2$ to measure the temperature ($T_c$) and the voltage ($V_c$) at this test (step ST208.) Subsequently, the test judgment unit 41 judges whether the test at $F_c$ can be executed or not (step ST209.) If the test cannot be executed, the maximum test operation frequency decision unit 43 decides $F_c - \Delta F_1$ as the present $F_{MAX}$. Accordingly, $T_c$ and $V_c$ of $F_c - \Delta F_1$ is decided as $T_c$ and $V_c$ of $F_{MAX}$ (step ST210) and the procedure goes to the step ST214. If the test can be executed in the step ST209, the procedure goes back to the step ST208 and the procedures will be repeated until the test cannot be executed in the step ST209.

If the test cannot be executed in the step ST207, the test unit 39 decrements the test operation frequency $F_c$ to $F_c - \Delta F_2$ as a new $F_c$ and a test is executed. Also, the temperature voltage measurement unit 9 controls the monitor block circuits $21_1$ and $21_2$ to measure $T_c$ and $V_c$ at this test (step ST211.) Subsequently, the test judgment unit 41 judges whether the test at $F_c$ can be executed or not (step ST212.) If this test can be executed, the maximum test operation frequency decision unit 43 decides $F_c$ as the present $F_{MAX}$ (step ST213), and the procedure goes to step ST214. If the test cannot be executed in the step ST212, the procedure goes back to the step ST211 and the procedures will be repeated until the test can be executed in the step ST212.

Subsequently, the present $F_{MAX}$ and the present test are transmitted from the test control unit 7 to the whole control unit 5. And the log writing unit 27 writes the transmitted $F_{MAX}$ at $T_c$ and $V_c$ of the present test in log. Also, the test operation frequency conversion unit 31 converts the $F_{MAX}$ into the test operation frequency $F_{MAX}@T_{TYP}, V_{TYP}$ at the standard temperature ($T_{TYP}$) and the standard voltage ($V_{TYP}$), and $F_{MAX}@T_{TYP}, V_{TYP}$ is written in log (step ST214.) Then, in the step ST215 which corresponds to the step ST112, the degradation amount calculation unit 33 calculates the present degradation amount referring to the past history in log and a threshold of an allowable degradation amount is subtracted from the calculated degradation amount. The procedures from step ST216 through ST218 is performed similarly as the procedures from the step ST113 through ST115 in the flowchart of FIG. 3.

By adopting the flow in FIG. 8, a test frequency is only increased or only decreased instead of increased and decreased. Thus, it is possible to decrease the number of iterations in the test and to shorten the time for field test, compared to the flow in FIG. 3.

Further, in order to obtain the present $F_{MAX}$, the frequency may be decreased before increased from the previous $F_{MAX}$. For example, the present $F_{MAX}$ may be obtained by increasing $F_c$, little by little, by $\Delta F_3$ which is smaller than $\Delta F_2$, between the steps ST212 and ST213 in FIG. 8.

Further, in the monitor block circuit $21_1$, the RO 59 and the counter 61 may be separately controlled. By this, it is possible to keep the RO 59 working and stop the counter 61. If the oscillation of RO 59 is stopped, the heating is stopped, influencing the monitor target circuit. Thus, the separate control and stopping the counter 61 can prevent the increase of circuits due to the increase of the number of bits.

Further, the initial $F_{MAX}$ (before degradation) may be obtained by executing the first test at the manufacturing test in the step ST008, not at the board/system test in the step ST010 in the flow of FIG. 2, to store the $F_{MAX}$ in a storing unit of a tester.

Further, the circuit under test 2 may be apart from the control circuit 3 as shown in FIG. 1. Otherwise, the semiconductor device 1 may include the circuit under test 2 and the circuit under test 2 and the control unit 3 may be included in a single entity. Additionally, the control unit 3 may be realized as a microcomputer or an FPGA (Field Programmable Gate Array.) Particularly, when the circuit under test 2 includes a storing unit 11, the initial $F_{MAX}$ (before degradation) may be obtained by executing the first test at the manufacturing test of the step ST008, not at the board/system test in the step ST010 in the flow of FIG. 2, to store the $F_{MAX}$ in the storing unit 11.

Further, a circuit which works as an RO as a result of combination of logic elements may be adopted in place of the RO 59. Additionally, a thermal sensor or a voltage sensor may be adopted instead of using the RO 59 to measure temperature and voltage when the measurement with higher accuracy is necessary. Here, it should be noted that a common sensor needs reference values for measurement. Besides, calibration before measurement and digital conversion procedure are also needed. In this regard, the RO 59 does not need a reference value for measurement. The calibration before measurement is not necessary, either. Further, additional digital conversion procedures are not needed, either, because the conversion can be performed based on a standard digital design. Therefore, it is favorable to use the RO 59.

Further, the semiconductor device 1 can detect variability which occurs in pluralities of same kinds of the circuit under tests 2, instead of detecting the degradation of a single circuit under test 2. Then, the whole control unit 5 may include variability amount calculation unit which calculates the degree of variability instead of the degradation amount calculation unit 33. The variability amount calculation unit calculates variability amount based on each of the maximum test operation frequencies, obtained for pluralities of same kinds of the circuit under tests 2, at the standard temperature and the standard voltage, calculated by the test operation frequency conversion unit 31.

DESCRIPTION OF SYMBOLS 1 semiconductor device, 2 circuit under test, 3 control circuit, 5 whole control unit, 7 test control unit, 9 temperature voltage measurement unit, 11 storing unit, 13 clock generation circuit, 15 test unit circuit, $21_1$ and $21_2$ monitor block circuit, 25 log reading unit, 27 log writing unit, 31 test operation frequency conversion unit, 33 degradation amount calculation unit, 35 degradation judgment unit, 37 test decision unit, 39 test unit, 41 test judgment unit, 43 maximum test operation frequency decision unit, 45 monitor measurement control unit, 47 temperature voltage calculation unit, 49 log storing unit, 51 logic path characteristic storing unit, 53 test information storing unit, test operation frequency correction value storing unit, 57 ring oscillator (RO)

The invention claimed is:

1. A semiconductor device for detecting degradation which occurs in a semiconductor integrated circuit having a detection target circuit portion where a test is executed, comprising:
 a decision unit that judges whether the test is executed within an allowable test timing in the detection target circuit portion at each test operation frequency or not and decides a maximum test operation frequency at which the test can be executed;
 a measurement unit that measures variables indicating test environment, the variables being a temperature and a voltage of where the detection target circuit portion is; and
 a calculation unit that converts the maximum test operation frequency decided by the decision unit based on the temperature and the voltage measured by the measurement unit into a maximum test operation frequency at a standard temperature and a standard voltage, and calculates, based on a converted maximum test operation frequency, a degradation amount which indicates degree of degradation;
 wherein the semiconductor integrated circuit has a monitor block circuit that monitors a value used by the measurement unit to measure the temperature and the voltage;
 the measurement unit has an estimation unit that estimates a temperature and a voltage of where the detection target circuit portion is, every time a test is executed, based on a monitored value by the monitor block circuit which operated at a temperature and a voltage of where the detection target circuit portion is;
 the calculation unit uses the temperature and the voltage estimated by the estimation unit as the temperature and the voltage measured by the measurement unit and converts the maximum test operation frequency decided by
the decision unit into the maximum test operation frequency at the standard temperature and the standard voltage;

the semiconductor device further comprises n (n is an integer equal to or more than 2) of the monitor block circuits;

the measurement unit measures a measured frequency $F_i$ (i is an integer equal to or less than n) obtained as an oscillation number of times at each monitor block circuit within a predetermined time; and the estimation unit estimates the temperature T and the voltage V of where the detection target circuit portion is by calculating coefficients $\alpha_i$, $\beta$, $\alpha'_i$, and $\beta'$ in an equation (eq1):

$$T = \sum_{i=1}^{n} \alpha_i F_i + \beta,$$

$$V = \sum_{i=1}^{n} \alpha'_i F_i + \beta'.$$ (eq1)

2. The semiconductor integrated circuit of claim 1,
wherein the estimation unit estimates the temperature T and the voltage V of where the detection target circuit portion is by dividing a temperature range or a voltage range into pluralities of divisions and calculating the coefficients $\alpha_i$, $\beta$, $\alpha'_i$, and $\beta'$ in an equation (eq1) for each of the divisions, or by dividing a temperature range into pluralities of divisions and calculating the coefficients $\alpha_i$, and $\beta$ in an equation (eq1) for each of the divisions with dividing a voltage range into pluralities of divisions and calculating the coefficients $\alpha'_i$, and $\beta'$ in an equation (eq1) for each of the divisions.

3. The semiconductor integrated circuit of claim 1,
wherein the estimation unit estimates the temperature T and the voltage V of where the detection target circuit portion is by using a frequency difference $\Delta F_i$ which is a difference between the measured frequency $F_i$ and a first measured frequency $F_{i0}$, instead of using the measured frequency $F_i$.

4. The semiconductor integrated circuit of claim 1, further comprising a storing unit that stores a combination of measured values measured by the measurement unit and a maximum test operation frequency decided by the decision unit,
wherein the calculation unit uses measured values and a maximum test operation frequency stored by the storing unit.

5. The semiconductor integrated circuit of claim 4,
wherein the maximum test operation frequency is decided through calculation to remove random noise based on pluralities of maximum test operation frequencies stored by the storing unit at different tests.

6. The semiconductor integrated circuit of claim 1,
wherein the measurement unit measures an initial temperature and an initial voltage in a test at a predetermined test operation frequency; and
the decision unit decides a maximum test operation frequency candidate at the initial temperature and the initial voltage using the standard temperature, the standard voltage and a maximum test operation frequency at a previous time, and decides, by decreasing a frequency after increasing or by only increasing or only decreasing a frequency, a maximum test operation frequency at which the test can be executed.

7. The semiconductor integrated circuit of claim 1,
wherein tests are prepared for each of different lengths of paths to be tested.

8. The semiconductor integrated circuit of claim 1,
wherein the test or an order of the test is modifiable according to an allowable test timing and/or the degradation amount.

9. A semiconductor device for detecting variability which occurs in pluralities of same kinds of semiconductor integrated circuits where a test is executed, comprising:
a decision unit that judges whether the test is executed within an allowable test timing in the detection target circuit portion at each test operation frequency or not and decides a maximum test operation frequency at which the test can be executed;
a measurement unit that measures variables indicating test environment, the variables being a temperature and a voltage where the detection target circuit portion is; and
a calculation unit that converts the maximum test operation frequency decided by the decision unit based on the temperature and the voltage measured by the measurement unit into a maximum test operation frequency at a standard temperature and a standard voltage, and calculates, based on a converted maximum test operation frequency, a variability amount which indicates degree of variability;
wherein the semiconductor integrated circuit has a monitor block circuit that monitors a value used by the measurement unit to measure the temperature and the voltage;
the measurement unit has an estimation unit that estimates a temperature and a voltage of where the detection target circuit portion is, every time a test is executed, based on a monitored value by the monitor block circuit which operated at a temperature and a voltage of where the detection target circuit portion is;
the calculation unit uses the temperature and the voltage estimated by the estimation unit as the temperature and the voltage measured by the measurement unit and converts the maximum test operation frequency decided by the decision unit into the maximum test operation frequency at the standard temperature and the standard voltage;
the semiconductor device further comprises n (n is an integer equal to or more than 2) of the monitor block circuits;
the measurement unit measures a measured frequency $F_i$ (i is an integer equal to or less than n) obtained as an oscillation number of times at each monitor block circuit within a predetermined time; and
the estimation unit estimates the temperature T and the voltage V of where the detection target circuit portion is by calculating coefficients $\alpha_i$, $\beta$, $\alpha'_i$, and $\beta'$ in an equation (eq1):

$$T = \sum_{i=1}^{n} \alpha_i F_i + \beta,$$

$$V = \sum_{i=1}^{n} \alpha'_i F_i + \beta'.$$ (eq1)

10. A detection method for detecting degradation which occurs in a semiconductor integrated circuit or variability which occurs in pluralities of same kinds of semiconductor integrated circuits, wherein the characteristic of relation among an operation frequency, temperature and a voltage of a detection target circuit portion of the semiconductor integrated circuit is approximated by an approximation formula, and
the semiconductor integrated circuit has n (n is an integer equal to or more than 2) monitor block circuits that monitors a value used by the measurement unit to measure the temperature and the voltage, the method comprising:

deciding a maximum test operation frequency at which a test can be executed within an allowable test timing in a detection target circuit portion of the semiconductor integrated circuit, using a decision unit;

measuring variables indicating test environment using a measurement unit, the variables being a temperature and a voltage;

calculating a maximum test operation frequency at a standard temperature and a standard voltage using the approximation formula, using the temperature, the voltage and the maximum test operation frequency and calculating, based on the maximum test operation frequency calculated, a degradation amount which indicates degree of degradation or a variability amount which indicates degree of variability, using a calculating unit;

measuring a measured frequency $F_i$ (i is an integer equal to or less than n) obtained as an oscillation number of times at each monitor block circuit within a predetermined time; and estimating temperature T and voltage V of where the detection target circuit portion is by calculating coefficients $\alpha_i$, $\beta$, $\alpha'_i$, and $\beta'$ in an equation (eq2):

$$T = \sum_{i=1}^{n} \alpha_i F_i + \beta, \qquad \text{(eq2)}$$
$$V = \sum_{i=1}^{n} \alpha'_i F_i + \beta'.$$

11. A non-transitory computer-readable storage medium having a program capable of causing a computer to execute the detection method of claim 10.

* * * * *